(12) United States Patent
Carpenter

(10) Patent No.: US 6,470,064 B2
(45) Date of Patent: Oct. 22, 2002

(54) EXTENDED LENGTH COUNTER CHAINS IN FPGA LOGIC

(75) Inventor: Michael K. Carpenter, Dallas, TX (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/973,147

(22) Filed: Oct. 8, 2001

(65) Prior Publication Data

US 2002/0012415 A1 Jan. 31, 2002

Related U.S. Application Data

(62) Division of application No. 09/481,093, filed on Jan. 11, 2000.

(51) Int. Cl.[7] .............................................. H03K 21/40
(52) U.S. Cl. ......................................... 377/50; 377/116
(58) Field of Search ............................ 377/51, 116, 50

(56) References Cited

U.S. PATENT DOCUMENTS 5,559,844 A * 9/1996 Lee ............................ 377/116
5,943,386 A * 8/1999 Chinn et al. ................ 377/116

* cited by examiner

*Primary Examiner*—Margaret R Wambach
(74) *Attorney, Agent, or Firm*—Colin M. Raufer; Leonard A. Alkov; Glenn H. Lenzen, Jr.

(57) ABSTRACT

A synchronous counter, the inventive counter is synchronized to a clock, e.g., a master clock of an FPGA, and includes a first counter that increments in response to the master clock, a resynchronizer that receives counter bits from the first counter and, when appropriate, generates an increment signal, and a second counter, clocked by the master clock, that increments in response to the increment signal. In a preferred embodiment, the resynchronizer is an n bit AND gate (where the first counter is an n-bit counter) that ANDs at least selected ones of the counter bits and a latch, e.g., a flip-flop, that latches the output of the AND gate. Thus, small counter chains are linked together using flip-flops clocked at the master clock rate, i.e., the same rate as the counter chains, to form a counter chain of any length that will function at the master clock rate. Accordingly, counter chains of unlimited size that can be implemented in a field programmable logic array (FPGA) and that can run at the maximum clock rate of the FPGA can be realized.

5 Claims, 1 Drawing Sheet

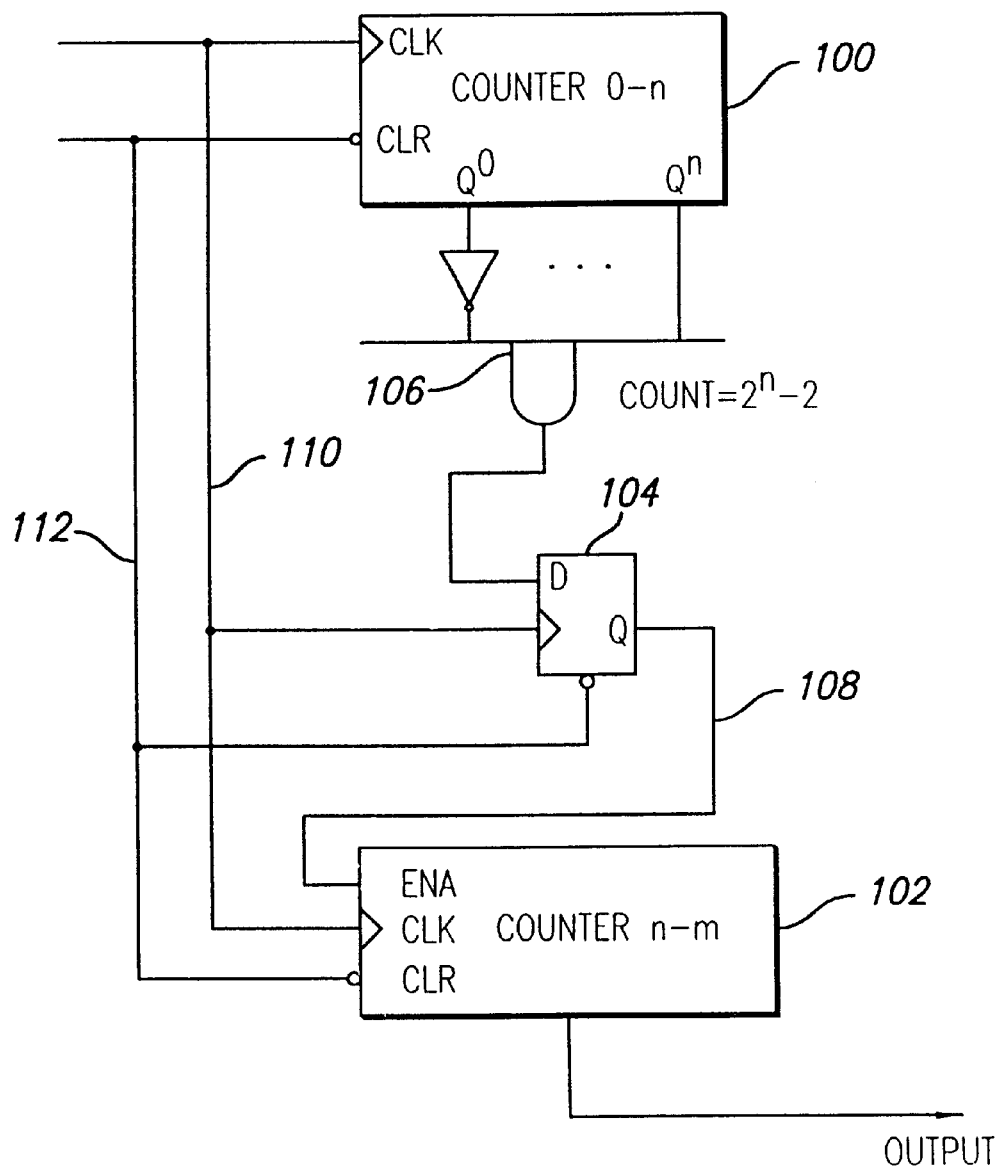

EXTENDED LENGTH COUNTER CHAINS IN FPGA LOGIC

This application is a divisional of Ser. No. 09/481,093, filed Jan. 11, 2000 still pending.

BACKGROUND OF THE INVENTION

1. Field of the Invention

The present invention relates to gate array logic. More specifically, the present invention relates to counter chains that may be implemented in field programmable gate array logic.

2. Description of the Related Art

The maximum length of prior art counter chains was limited by the carry-forward ripple delay through the chain. Typical field programmable logic arrays (FPGAs) include variable length counter chains with a serial carry look-ahead output. These variable length counter chains are linked together with the carry look-ahead output of one counter chain stage being passed to a carry input of the next counter chain stage. When the individual stage delay, as multiplied by the number of stages in a counter, exceeded the period between clocks, the counter would no longer count correctly. Further, even if these counters include fast look-ahead logic, there remains the fundamental counter chain length limitation that the overall carry delay, increased by each stage, must not exceed the clock period. So, for example, on a typical currently available FPGA, the longest counter chain supported with a basic clock rate of 80 Megahertz, the maximum number of counter stages is about 17 or 18 stages.

Accordingly, there is a need for counter chains that may be of any length without regard to the carry-forward ripple delay.

SUMMARY OF THE INVENTION

The present invention is a synchronous counter synchronized to a master clock. The master clock may be a clock on an FPGA chip. The counter includes a first counter that increments in response to the master clock. A resynchronizer receives counter bits from the first counter and, when appropriate, generates an increment signal. A second counter, clocked by the master clock, increments in response to the increment signal. The resynchronizer is an n bit AND gate (where the first counter is an n-bit counter) that ANDs at least selected ones of the counter bits of the first counter, and a latch clocked by the master clock for latching the output of the AND gate. Thus, small counter chains are linked together using flip-flops clocked at the master clock rate, i.e., the same rate as the counter chains, to form a counter chain of any length that will function at the master clock rate. Accordingly, the present invention encompasses counter chains of unlimited size that can be implemented in a field programmable logic array (FPGA) and that can run at the maximum clock rate of the FPGA.

BRIEF DESCRIPTION OF THE DRAWINGS

The sole FIGURE depicts a counter including a look ahead resynchronizing stage according to a preferred embodiment of the present invention.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility. Nonetheless, those skilled in the art will appreciate that logic gates other than AND gates may be used and delay elements other than flip-flops may be used without departing from the scope of the present teachings.

Flip-flop 104 is clocked at the same rate as the counter chains, i.e. at the master clock rate. AND gate 106 (or a circuit providing an equivalent function) ANDs all but the least significant of the n counter bits and passes the result to the data input of flip-flop 104. The output 108 of flip-flop 104 is passed to the enable input of second n bit counter 102. Although counters 100, 102 are shown in this example to be identical n bit counters, this is by way of example only and not intended as a limitation. Also, although the exemplary embodiment includes two counters 100, 102 synchronized by a resynchronizer, any number of counters may be linked using a resynchronizer between linked pairs without departing from the spirit or scope of the invention.

Essentially, the resynchronizer stage captures the output of the first n bit counter 100 when it reaches the count of $2^n-2$, i.e., one count state before the normal rollover point of $2^n-1$. Thus, by clocking a resynchronizing flip-flop at this point, the counter carry string is anticipated and the flip-flop output 108 is synchronized to the main clock 110. The flip-flop output 108 enables the second n bit counter 102 for a single clock period. During that clock period, the second n bit counter is incremented once and disabled in the next clock period, when the clock 112 resets flip-flop 104. Thus, the entire counter chain counts normally, even though the carry delay for the n bit counters may exceed the clock period.

For comparison, a prior art counter and a counter according to the preferred embodiment of the present invention were implemented on a commercially available FPGA chip, a Flex 8000 chip from Altera. The fastest prior art counter was limited to 32 stages at a maximum chip clock rate of 20 MHz. However, the 32 bit counter of the present invention exhibited no failures with the chip clock speed extended to 80 MHz.

Accordingly, the present invention is applicable to all counter designs for FPGA's or similar devices that incorporate long counter strings. The present invention allows the use of cheaper and slower devices than could otherwise be used with a ripple carry type counter.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly, what is claimed is:

1. A carry anticipation circuit for use with an n-bit counter comprising:

first means for anticipating a generation of the carry signal by said counter by logically analyzing a count thereof and providing a first signal in response thereto, said first means including means for capturing the output of said counter when it reaches a count of $2^n-2$ and second means for outputting said first signal during a predetermined time interval.

2. The invention of claim 1 wherein said means for capturing the output of said counter includes a logic circuit.

3. The invention of claim 2 wherein said logic circuit includes a multiple input AND gate.

4. The invention of claim 3 wherein said AND gate ANDs all but the least significant bit of said n-bit counter.

5. The invention of claim 1 wherein said means for outputting said first signal includes a flip-flop.

* * * * *